United States Patent
Fukunaga et al.

(10) Patent No.: US 12,194,594 B2
(45) Date of Patent: Jan. 14, 2025

(54) SUBSTRATE PROCESSING METHOD AND SUBSTRATE PROCESSING APPARATUS

(71) Applicant: Tokyo Electron Limited, Tokyo (JP)

(72) Inventors: Nobutaka Fukunaga, Kumamoto (JP); Takeshi Matsumoto, Kumamoto (JP); Tomohiro Kaneko, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 286 days.

(21) Appl. No.: 17/776,642

(22) PCT Filed: Nov. 2, 2020

(86) PCT No.: PCT/JP2020/041073
§ 371 (c)(1),
(2) Date: May 13, 2022

(87) PCT Pub. No.: WO2021/095588
PCT Pub. Date: May 20, 2021

(65) Prior Publication Data
US 2022/0402094 A1  Dec. 22, 2022

(30) Foreign Application Priority Data
Nov. 15, 2019 (JP) .................. 2019-207443

(51) Int. Cl.
*B24B 49/05* (2006.01)
*H01L 21/304* (2006.01)
*H01L 21/66* (2006.01)

(52) U.S. Cl.
CPC ............ *B24B 49/05* (2013.01); *H01L 21/304* (2013.01); *H01L 22/12* (2013.01)

(58) Field of Classification Search
CPC ......... B24B 49/05; B24B 49/03; B24B 49/04; B24B 49/00; B24B 49/12; B24B 7/04;
(Continued)

(56) References Cited

U.S. PATENT DOCUMENTS 6,514,861 B1 * 2/2003 Yang ................. B24B 49/05
438/959
2005/0142991 A1 * 6/2005 Nakao .............. B24B 37/013
451/64
(Continued)

FOREIGN PATENT DOCUMENTS

JP  2009-090389 A  4/2009
JP  2013-119123 A  6/2013
(Continued)

OTHER PUBLICATIONS

International Search Report of PCT/JP2020/041073 dated Jan. 26, 2021.

*Primary Examiner* — Steven M Cernoch
*Assistant Examiner* — Kent N Shum
(74) *Attorney, Agent, or Firm* — Shih IP Law Group, PLLC.

(57) ABSTRACT

A substrate processing method includes measuring a first thickness distribution of a first substrate in a first one of multiple combined substrates before being subjected to a finishing grinding; measuring a second thickness distribution of the first substrate in a second one of the multiple combined substrates before being subjected to the finishing grinding; deciding a relative inclination between a substrate holder configured to hold the second one of the multiple combined substrates and a grinder configured to perform the finishing grinding on the corresponding combined substrate, based on first difference data between the first thickness distribution and the second thickness distribution; and performing finishing grinding on the first substrate in the second one of the multiple combined substrates while holding the second one of the multiple combined substrates at the inclination which is decided.

10 Claims, 6 Drawing Sheets

(58) Field of Classification Search
CPC . H01L 21/304; H01L 21/30625; H01L 22/12; H01L 21/66; H01L 21/67092; H01L 21/67
See application file for complete search history.

(56) References Cited

U.S. PATENT DOCUMENTS

| | | | |
|---|---|---|---|
| 2017/0095902 A1* | 4/2017 | Yoshida | B24B 7/228 |
| 2018/0047699 A1* | 2/2018 | Omori | H01L 21/2007 |
| 2020/0180105 A1* | 6/2020 | Inoue | B24B 51/00 |

FOREIGN PATENT DOCUMENTS

| | | | |
|---|---|---|---|
| JP | 2013193156 A | * | 9/2013 |
| JP | 2014-226749 A | | 12/2014 |

* cited by examiner

SUBSTRATE PROCESSING METHOD AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2020/041073 filed on Nov. 2, 2020, which claims the benefit of Japanese Patent Application No. 2019-207443 filed on Nov. 15, 2019, the entire disclosures of which are incorporated herein by reference.

TECHNICAL FIELD

The various aspects and embodiments described herein pertain generally to a substrate processing method and a substrate processing apparatus.

BACKGROUND

Patent Document 1 discloses a grinding method for a plate-shaped workpiece composed of a first plate-shaped workpiece and a second plate-shaped workpiece bonded to each other. The grinding method includes a process of measuring a thickness at at least three measurement positions of the first plate-shaped workpiece held by a holding table, a process of adjusting parallelism of the first plate-shaped workpiece based on the measured thicknesses, and a process of grinding the second plate-shaped workpiece after the adjustment of the parallelism.

PRIOR ART DOCUMENT

Patent Document 1: Japanese Patent Laid-open Publication No. 2014-226749

DISCLOSURE OF THE INVENTION

Means for Solving the Problems

In an exemplary embodiment, there is provided a substrate processing method of performing, in a substrate processing apparatus, finishing grinding on a roughly ground first substrate in a combined substrate in which the first substrate and a second substrate are bonded to each other. The combined substrate includes multiple combined substrates, and the multiple combined substrates are successively processed in the substrate processing apparatus. The substrate processing method includes measuring a first thickness distribution of the first substrate in a first one of the multiple combined substrates before being subjected to the finishing grinding; measuring a second thickness distribution of the first substrate in a second one of the multiple combined substrates before being subjected to the finishing grinding; deciding a relative inclination between a substrate holder configured to hold the second one of the multiple combined substrates and a grinder configured to perform the finishing grinding on the corresponding combined substrate, based on first difference data between the first thickness distribution and the second thickness distribution; and performing finishing grinding on the first substrate in the second one of the multiple combined substrates while holding the second one of the multiple combined substrates at the inclination which is decided.

DETAILED DESCRIPTION

Recently, in a manufacturing process for a semiconductor device, in a combined substrate in which a semiconductor substrate (hereinafter, referred to as "first substrate") having devices such as a plurality of electronic circuits formed on a front surface thereof and a second substrate are bonded to each other, the first substrate is thinned by grinding a rear surface thereof.

Figure 1:
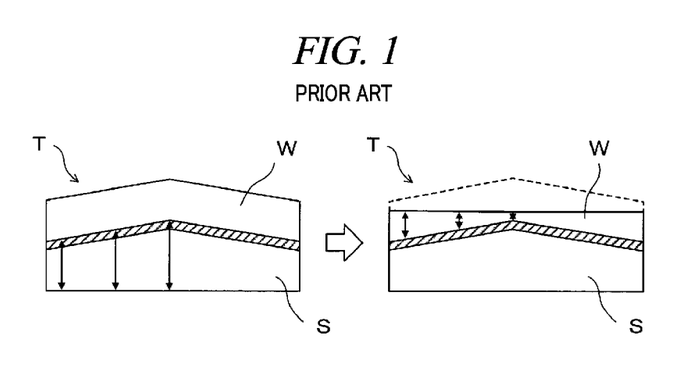
FIG. 1 is an explanatory diagram schematically illustrating degradation of TTV of a conventional first wafer.

The thinning of the first substrate is performed by bringing a grinding whetstone into contact with the rear surface of the first substrate in the state that a rear surface of the second substrate is held by a substrate holder. However, when performing the grinding of the first substrate in this way, if a thickness distribution in the diametrical direction of the second substrate held by the substrate holder is not uniform, the degree of flatness (TTV: Total Thickness Variation) of the first substrate after being ground may be degraded. Specifically, as shown in FIG. 1, in a portion within a surface of a combined substrate T where a thickness of a second substrate S is small, a thickness of a first substrate W becomes large, whereas in a portion where the thickness of the second substrate S is large, the thickness of the first substrate W becomes small.

The grinding method disclosed in the aforementioned Patent Document 1 is a method for grinding the first substrate (second plate-shaped workpiece) to a uniform thickness by detecting non-uniformity in the thickness of the second substrate (first plate-shaped workpiece) and adjusting an inclination of the substrate holder (holding table). In the grinding method disclosed in Patent Document 1, the thickness of the second substrate (first plate-shaped workpiece) is directly calculated by measurement light emitted from a non-contact type thickness measuring device provided above the combined substrate (plate-shaped workpiece). Further, the measurement light penetrates the first substrate (second plate-shaped workpiece).

However, when devices are formed on the front surface of the first substrate as stated above, for example, that is, when a device layer, which is a metal film, is interposed between the first substrate and the second substrate, the thickness of the second substrate including the metal film may not be calculated properly. To elaborate, since the measurement light (for example, IR light) cannot penetrate the device layer which is the metal film, the thickness of the second substrate including the metal film can be measured properly from neither the first substrate side nor the second substrate side. Since a thickness distribution of the second substrate including the metal film cannot be measured appropriately for this reason, an inclination of the grinding whetstone to be brought into contact with the first substrate, that is, a grinding amount may not calculated appropriately, making it difficult to improve the degree of flatness of the first substrate after being ground. In this regard, there is still a room for improvement in the conventional grinding method for grinding the first substrate to the uniform thickness.

In this regard, exemplary embodiments of the present disclosure provides a technique enabling to appropriately improve flatness of a first substrate in a combined substrate in which the first substrate and a second substrate are bonded to each other. Hereafter, a processing apparatus as a substrate processing apparatus and a processing method as a substrate processing method according to an exemplary embodiment will be described with reference to the accompanying drawings. Further, in the present specification and the drawings, parts having substantially the same functions and configurations will be assigned same reference numerals, and redundant description thereof will be omitted.

Figure 2:
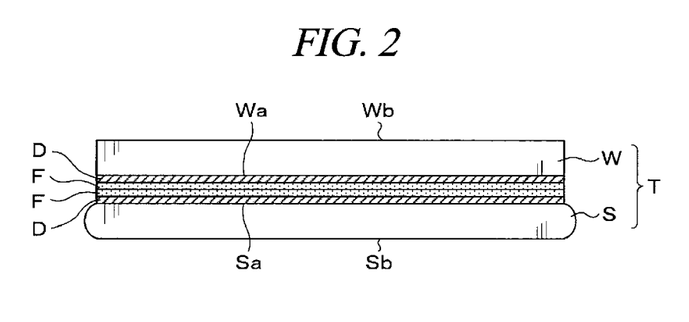
FIG. 2 is an explanatory diagram illustrating an example structure of a combined wafer.

In a processing apparatus 1 to be described later according to an exemplary embodiment, a processing is performed on a combined wafer T as a combined substrate in which a first wafer W as a first substrate and a second wafer S as a second substrate are bonded to each other as shown in FIG. 2. In the processing apparatus 1, the first wafer W is thinned. Hereinafter, in the first wafer W, a surface to be bonded to the second wafer S will be referred to as a front surface Wa, and a surface opposite to the front surface Wa will be referred to as a rear surface Wb. Likewise, in the second wafer S, a surface to be bonded to the first wafer W will be referred to as a front surface Sa, and a surface opposite to the front surface Sa will be referred to as a rear surface Sb.

The first wafer W is a semiconductor wafer such as, but not limited to, a silicon wafer, and has, on the front surface Wa thereof, a device layer D including a plurality of devices. Further, a surface film F is formed on the device layer D, and the device layer D is bonded to the second wafer S with this surface film F therebetween. The surface film F may be, by way of non-limiting example, an oxide film (a $SiO_2$ film or a TEOS film), a SiC film, a SiCN film, an adhesive, or the like. Further, to suppress a peripheral portion of the first wafer W from having a sharp pointed shape (a so-called knife edge shape) by a grinding processing in the processing apparatus 1, the peripheral portion is previously removed. The peripheral portion may be in the range of e.g., 0.5 mm to 3 mm from an edge of the first wafer W in the diametrical direction thereof.

The second wafer S has the same configuration as that of the first wafer W, for example, and the device layer D and the surface film F are formed on the front surface Sa thereof. Further, a peripheral portion of the second wafer S is chamfered, and the thickness of the peripheral portion decreases toward a leading end thereof on a cross section thereof. The second wafer S does not need to be a device wafer on which the device layer D is formed, and it may be, for example, a support wafer configured to support the first wafer W. In this case, the second wafer S functions as a protection member configured to protect the device layer D on the front surface Wa of the first wafer W.

In addition, in the following description, in order to avoid complication of illustration, the device layer D and the surface film F may be marked together, and they may sometimes be referred to as a device layer and surface film "DF".

Figure 3:
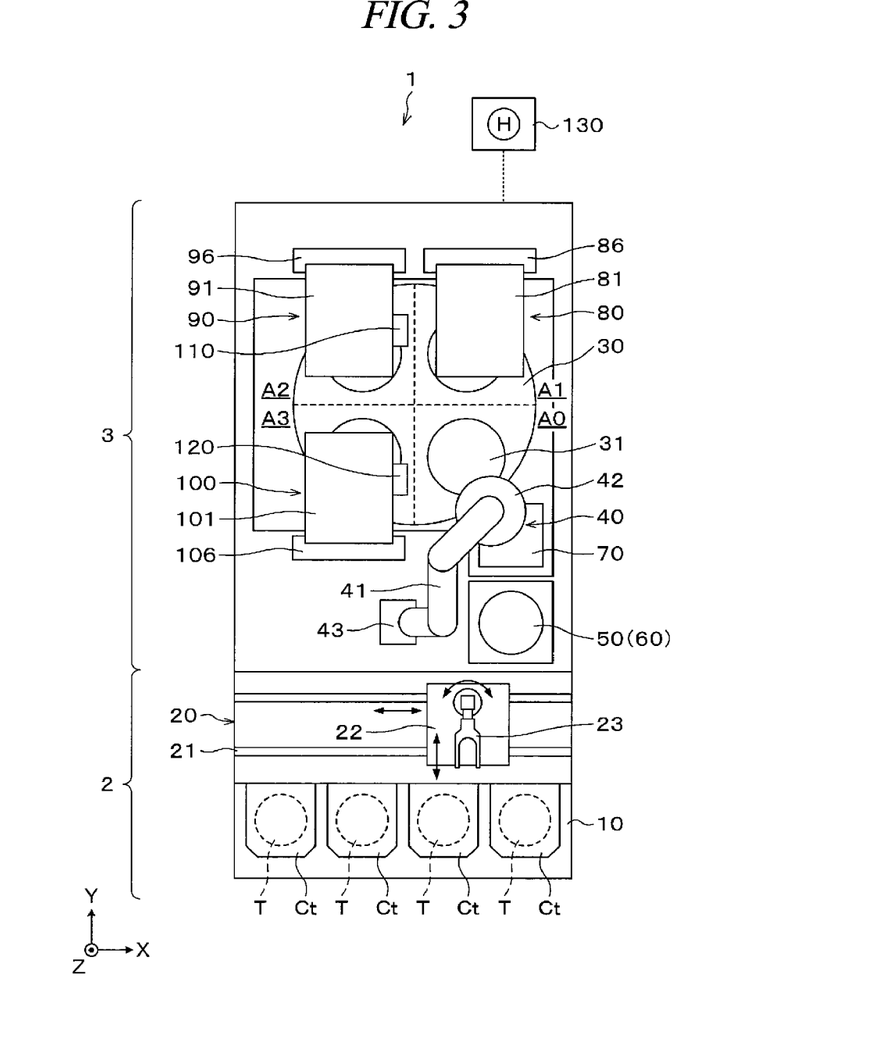
FIG. 3 is a plan view schematically illustrating an example configuration of a processing apparatus.

As depicted in FIG. 3, the processing apparatus 1 has a structure in which a carry-in/out station 2 and a processing station 3 are connected as one body. In the carry-in/out station 2, a cassette Ct capable of accommodating a plurality of combined wafers T therein is carried to/from the outside, for example. The processing station 3 is equipped with various kinds of processing apparatuses each configured to perform a required processing on the combined wafer T.

The carry-in/out station 2 is equipped with a cassette placing table 10. In the shown example, a plurality of, for example, four cassettes Ct can be arranged on the cassette placing table 10 in a row in the X-axis direction. Further, the number of the cassettes Ct placed on the cassette placing table 10 is not limited to the example of the present exemplary embodiment but may be selected as required.

In the carry-in/out station 2, a wafer transfer section 20 is provided adjacent to the cassette placing table 10 on the positive Y-axis side of the cassette placing table 10. Provided in the wafer transfer section 20 is a wafer transfer device 22 configured to be movable on a transfer path 21 which is elongated in the X-axis direction. The wafer transfer device 22 is equipped with a transfer fork 23 configured to hold and transfer the combined wafer T. The transfer fork 23 attracts and holds the combined wafer T with its biforked leading ends. The transfer fork 23 transfers the combined wafer T before and after being subjected to the grinding processing, for example. The transfer fork 23 is configured to be movable in a horizontal direction and a vertical direction and pivotable around a horizontal axis and a vertical axis.

Further, the configuration of the wafer transfer device 22 is not limited to the present exemplary embodiment, and various other configurations may be adopted. By way of example, the wafer transfer device 22 may be equipped with two transfer forks 23 respectively configured to transfer the combine wafer T before being subjected to the grinding processing and the combined wafer T after being subjected to the grinding processing.

In the processing station 3, processings such as grinding and cleaning is performed on the combined wafer T. The processing station 3 includes a rotary table 30, a transfer unit 40, an alignment unit 50, a first cleaning unit 60, a second cleaning unit 70, a rough grinding unit 80, an intermediate grinding unit 90, and a finishing grinding unit 100 as a finishing grinding device.

The rotary table 30 is configured to be rotated by a rotating mechanism (not shown). Four chucks 31 each of which serves as a substrate holder configured to attract and hold the combined wafer T are provided on the rotary table 30. The chucks 31 are arranged on a circle concentric with the rotary table 30 at a regular distance therebetween, that is, at an angular distance of 90 degrees therebetween. The four chucks 31 are configured to be moved to a delivery position A0 and processing positions A1 to A3 as the rotary table 30 is rotated. Further, each of the chucks 31 is configured to be rotated around a vertical axis by a rotating mechanism (not shown).

As depicted in FIG. 3, in the present exemplary embodiment, the delivery position A0 is a position on the positive X-axis and negative Y-axis side of the rotary table 30. The second cleaning unit 70, the alignment unit 50, and the first cleaning unit 60 are disposed on the negative Y-axis side of the delivery position A0. The alignment unit 50 and the first cleaning unit 60 are stacked in this order from above. The first processing position A1 is a position on the positive X-axis and positive Y-axis side of the rotary table 30, and the rough grinding unit 80 is disposed thereat. The second processing position A2 is a position on the negative X-axis and positive Y-axis side of the rotary table 30, and the intermediate grinding unit 90 is disposed thereat. The third processing position A3 is a position on the negative X-axis and negative Y-axis side of the rotary table 30, and the finishing grinding unit 100 is disposed thereat.

The chuck 31 may be, for example, a porous chuck. The chuck 31 attracts and holds the rear surface Sb of the second wafer S that constitutes the combined wafer T. When viewed from the side, a front surface of the chuck 31, that is, a holding surface of the combined wafer T has a protruding shape with a central portion thereof protruding higher than an end portion thereof. Further, since the protrusion of this central portion is minute, illustration of the protruding shape of the chuck 31 will be omitted in the following description.

Figure 4:
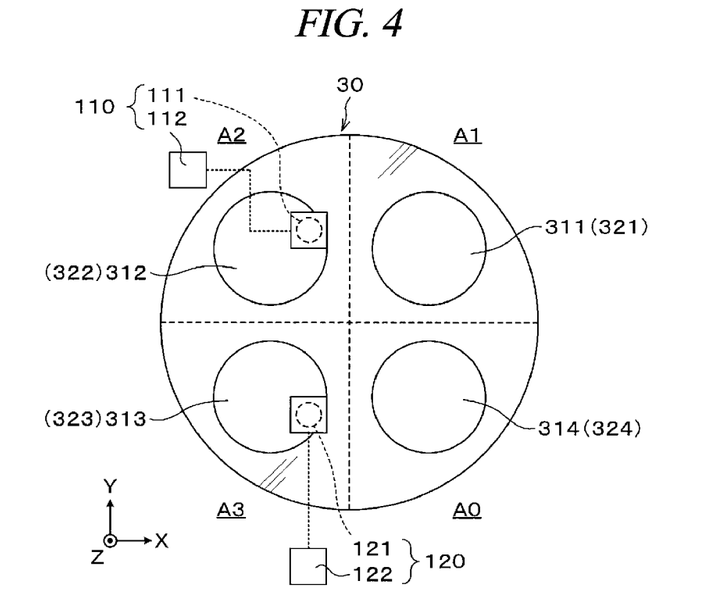
FIG. 4 is a plan view illustrating a schematic configuration of a rotary table.

Each chuck 31 is held by a chuck base 32. In the following description, as shown in FIG. 4, the four chuck bases positioned at the processing positions A1 to A3 and the delivery position A0 may sometimes be respectively referred to as a first chuck base 321, a second chuck base 322, a third chuck base 323, and a fourth chuck base 324. The chuck bases 321 to 324 hold the chucks 311 to 314, respectively.

Figure 5:
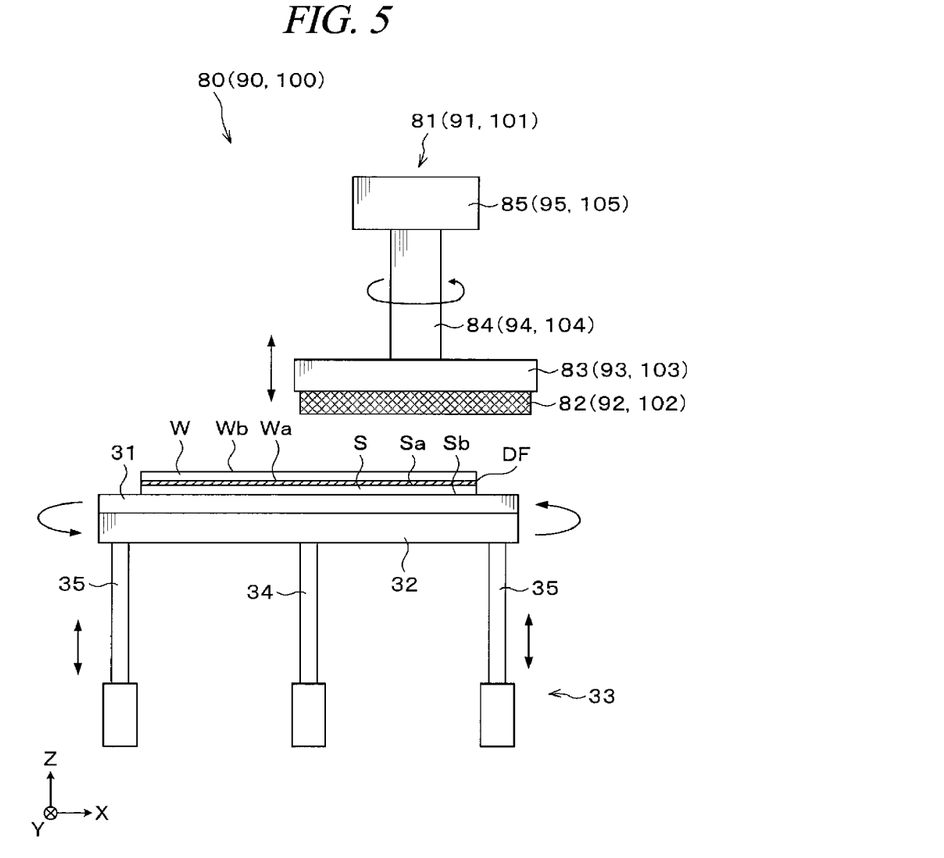
FIG. 5 is a side view illustrating a schematic configuration of each grinding unit.

As illustrated in FIG. 5, the chuck base 32 is provided with an inclination adjuster 33 configured to adjust an inclination of the chuck 31 and the chuck base 32 from a horizontal direction. The inclination adjuster 33 has a fixed shaft 34 and a plurality of elevating shafts 35 provided on a bottom surface of the chuck base 32. Each of the elevating shafts 35 is configured to be extensible/contractible, and moves the chuck base 32 up and down. By using the inclination adjuster 33 to raise or lower one end of an outer periphery of the chuck base 32 in a vertical direction with respect to the other end thereof (a position corresponding to the fixed shaft 34), the chuck 31 and the chuck base 32 can be inclined. Thus, it is possible to adjust an inclination of the rear surface Wb of the first wafer W as a grinding surface with respect to grinding whetstones belonging to the various kinds of grinding units at the processing positions A1 to A3.

Further, the configuration of the inclination adjuster 33 is not limited to the above-described example, and any of various other configurations may be adopted as long as it is capable of adjusting the relative angle (parallelism) of the first wafer W with respect to the grinding whetstone.

As depicted in FIG. 3, the transfer unit 40 is a multi-joint robot equipped with a plurality of, for example, three arms 41. Each of the three arms 41 is configured to be rotatable. The arm 41 at a leading end is equipped with a transfer pad 42 configured to attract and hold the combined wafer T. The arm 41 at a base end is mounted to an elevating mechanism 43 configured to move this arm 41 in a vertical direction. The transfer unit 40 having this configuration is capable of transferring the combined wafer T to/from the delivery position A0, the alignment unit 50, the first cleaning unit 60, and the second cleaning unit 70.

In the alignment unit 50, a direction of the combined wafer T before being subjected to the grinding processing in a horizontal direction is adjusted. By way of example, while rotating the combined wafer T held by a spin chuck (not shown), a position of a notch of the first wafer W is detected by a detector (not shown), and by adjusting the position of the notch, the direction of the combined wafer T in the horizontal direction is adjusted.

In the first cleaning unit 60, the rear surface Wb of the first wafer W after being subjected to the grinding processing is cleaned, and, more specifically, cleaned by spinning. By way of example, while rotating the combined wafer T held by a spin chuck (not shown), a cleaning liquid is supplied to the rear surface Wb of the first wafer W from a cleaning liquid nozzle (not shown). The supplied cleaning liquid diffuses on the rear surface Wb, so that the rear surface Wb is cleaned.

In the second cleaning unit 70, the rear surface Sb of the second wafer S is cleaned in the state that the combined wafer T after being subjected to the grinding processing is held by the transfer pad 42, and, also, the transfer pad 42 is cleaned.

In the rough grinding unit 80, the rear surface Wb of the first wafer W is roughly ground. The rough grinding unit 80 is equipped with a rough grinder 81. As depicted in FIG. 5, the rough grinder 81 has a rough grinding wheel 82, a mount 83, a spindle 84, and a driver 85. The rough grinding wheel 82 is equipped with a rough grinding whetstone on a bottom surface thereof, and has an annular shape. The rough grinding wheel 82 is supported on the mount 83. The mount 83 is provided with the driver 85 with the spindle 84 therebetween. The driver 85 incorporates therein, for example, a motor (not shown), and serves to rotate the rough grinding wheel 82 and move it in a vertical direction along a supporting column 86 shown in FIG. 3. In the rough grinding unit 80, by respectively rotating the chuck 31 and the rough grinding wheel 82 while keeping the first wafer W of the combined wafer T held by the chuck 31 in contact with a part of an arc of the rough grinding wheel 82, the rear surface Wb of the first wafer W is roughly ground.

In the intermediate grinding unit 90, the rear surface Wb of the first wafer W is ground to an intermediate level. The configuration of the intermediate grinding unit 90 is substantially the same as the configuration of the rough grinding unit 80, as shown in FIG. 3 and FIG. 5. The intermediate grinding unit 90 includes an intermediate grinder 91, an intermediate grinding wheel 92, a mount 93, a spindle 94, a driver 95, and a supporting column 96. Further, a particle size of abrasive grains of the intermediate grinding whetstone is smaller than a particle size of abrasive grains of the rough grinding whetstone.

In the finishing grinding unit 100, the rear surface Wb of the first wafer W is ground finely. The configuration of the finishing grinding unit 100 is substantially the same as the configuration of the rough grinding unit 80 and the intermediate grinding unit 90, as illustrated in FIG. 3 and FIG. 5. The finishing grinding unit 100 includes a finishing grinder 101, a finishing grinding wheel 102, a mount 103, a spindle 104, a driver 105, and a supporting column 106. Further, a particle size of abrasive grains of the finishing grinding whetstone is smaller than the particle size of the abrasive grains of the intermediate grinding whetstone.

Furthermore, the processing station 3 is equipped with a thickness measuring unit 110 configured to measure the thickness of the first wafer W upon the completion of the intermediate grinding, and a thickness measuring unit 120 configured to measure the thickness of the first wafer W upon the completion of the finishing grinding. The thickness measuring unit 110 is provided at, for example, the processing position A2 or the processing position A3. The thickness measuring unit 120 is provided at, for example, the processing position A3 or the delivery position A0. Further, a thickness measuring device (not shown) configured to detect an endpoint of the various kinds of grinding processings at the processing positions A1 to A3 is provided at each of the processing positions A1 to A3. When the thickness of the first wafer W measured by the thickness measuring device reaches a target thickness, the rotary table 30 is rotated to move the first wafer W. In addition, at the processing positions A2 and A3, the above-described thickness measuring units 110 and 120 may be used as the thickness measuring device for performing the endpoint detection.

The thickness measuring unit 110 as a first thickness distribution measuring device includes a sensor 111 and an operation unit 112, as illustrated in FIG. 4. The sensor 111 is, for example, a non-contact type sensor, and it measures the thickness of the first wafer W before being subjected to the finishing grinding. The sensor 111 measures the thickness of the first wafer W at multiple points thereof. Measurement results of the sensor 111 are output to the operation unit 112. The operation unit 112 acquires a thickness distribution of the first wafer W from the measurement results (thicknesses of the first wafer W) of the sensor 111 at the multiple points. At this time, TTV data of the first wafer W may also be calculated. Further, the thickness of the first wafer W measured by the thickness measuring unit 110 is just the thickness of the silicon portion of the first wafer W, and it does not include the thickness of the device layer D and the thickness of the surface film F.

The thickness measuring unit 120 as a second thickness distribution measuring device has the same configuration as the thickness measuring unit 110 as shown in FIG. 4, and it includes a sensor 121 and an operation unit 122. In the thickness measuring unit 120, the sensor 121 acquires the thickness of the first wafer W after being subjected to the finishing grinding, and the operation unit 122 calculates TTV data.

In addition, in the thickness measurement of the first wafer W using the thickness measuring units 110 and 120, the thickness of the first wafer W is measured at a plurality of measurement points in the diametrical direction of the first wafer W. At each of the plurality of measurement points in the diametrical direction, while rotating the combined wafer T, the thickness of the first wafer W is measured at multiple points in the circumferential direction. Then, a moving average value or a moving median value of the thicknesses measured at the multiple points in the circumferential direction is calculated, and the calculated value may be used as the thickness of the first wafer W at the corresponding measurement point in the diametrical direction.

Further, instead of using the moving average value or the moving median value of the multiple points as the thickness of the first wafer W, the thickness of the first wafer W at certain designated coordinates may be measured, and the measured thickness may be used as the thickness of the first wafer W as a representative value.

In addition, the configuration of the thickness measuring units 110 and 120 are not limited to the present exemplary embodiment, and any of various other configurations may be adopted as long as the thickness distribution and the TTV data of the first wafer W can be obtained.

As depicted in FIG. 3, the above-described processing apparatus 1 is equipped with a controller 130. The controller 130 is implemented by, for example, a computer equipped with a CPU and a memory, and includes a program storage (not shown). A program for controlling the processing of the combined wafer T in the processing apparatus 1 is stored in the program storage. Further, the program storage also stores therein a program for controlling operations of the above-described various kinds of processing units and a driving system such as the transfer devices to implement a processing to be described later in the processing apparatus 1. The program may be recorded on a computer-readable storage medium H and installed from the recording medium H to the controller 130.

Now, a processing method performed by using the processing apparatus 1 having the above-described configuration will be explained. In the present exemplary embodiment, the combined wafer T is previously formed by bonding the first wafer W and the second wafer S in a bonding apparatus (not shown) outside the processing apparatus 1. Further, the peripheral portion of the first wafer W is removed in advance.

First, the cassette Ct having therein a multiple number of combined wafers T is placed on the cassette placing table 10 of the carry-in/out station 2.

Then, the combined wafer T is taken out of the cassette Ct by the transfer fork 23 of the wafer transfer device 22, and transferred into the alignment unit 50 of the processing station 3.

In the alignment unit 50, by adjusting the position of the notch of the first wafer W while rotating the combined wafer T held by the spin chuck (not shown) as described above, the direction of the combined wafer T in the horizontal direction is adjusted.

Next, the combined wafer T is transferred from the alignment unit 50 to the delivery position A0 by the transfer unit 40, and handed over onto the chuck 31 located at the delivery position A0. Thereafter, the chuck 31 is moved to the first processing position A1. Then, the rear surface Wb of the first wafer W is roughly ground by the rough grinding unit 80.

Subsequently, the chuck 31 is moved to the second processing position A2. Then, the rear surface Wb of the first wafer W is ground to an intermediate level by the intermediate grinding unit 90.

Next, the chuck 31 is moved to the third processing position A3. Then, the rear surface Wb of the first wafer W is finely ground by the finishing grinding unit 100. The detailed method of the finishing grinding in the present exemplary embodiment will be elaborated later.

Thereafter, the chuck 31 is moved to the delivery position A0. Here, by using the cleaning liquid nozzle (not shown), the rear surface Wb of the first wafer W is roughly cleaned with the cleaning liquid. In this process, the cleaning is performed to reduce the contamination of the rear surface Wb to some extent.

Then, the combined wafer T is transferred from the delivery position A0 to the second cleaning unit 70 by the transfer unit 40. In the second cleaning unit 70, the rear surface Sb of the second wafer S is cleaned and dried in the state that the combined wafer T is held by the transfer pad 42.

Subsequently, the combined wafer T is transferred from the second cleaning unit 70 to the first cleaning unit 60 by the transfer unit 40. In the first cleaning unit 60, the rear surface Wb of the first wafer W is finally cleaned with the cleaning liquid by using the cleaning liquid nozzle (not shown). In this process, the rear surface Wb is cleaned to a required level of cleanliness and dried.

Thereafter, the combined wafer T after being subjected to all the required processings is transferred to the cassette Ct of the cassette placing table 10 by the fork 23 of the wafer transfer device 22. Then, upon the completion of the processings on all the combined wafers T in the cassette Ct, a series of processings in the processing apparatus 1 is ended. In addition, in the processing apparatus 1, the processing of the combined wafers T may be performed in a single-wafer unit. That is, after the processing of one combined wafer T is finished, the processing of another combined wafer T may be started. Alternatively, the processings of the plurality of combined wafers T may be performed successively, that is, the processings of the plurality of combined wafers T in the processing apparatus 1 may be performed simultaneously.

In the processing apparatus 1 as described above, the processing is successively performed on the plurality of combined wafers T accommodated in the cassette Ct. In order to perform the grinding processing on the plurality of combined wafers T uniformly in the processing apparatus 1, that is, in order to uniformly control the thickness distribution of the first wafer W in each combined wafer T after being subjected to the finishing grinding, it is necessary to consider the thickness distribution in the surface of the second wafer S as described above. Hereinafter, the finishing grinding method for the first wafer W considering the thickness distribution of the second wafer S in the processing apparatus 1 will be explained.

In the following description, the $n^{th}$ sheet of combined wafer T to be processed in the processing apparatus 1 may sometimes be referred to as "combined wafer Tn". Likewise, the first wafer W and the second wafer S constituting the $n^{th}$ sheet of combined wafer T to be processed may sometimes be referred to as "first wafer Wn" and "second wafer Sn", respectively.

In implementing the above-described grinding method, the processing apparatus 1 is equipped with, as illustrated in FIG. 3 and FIG. 4, the thickness measuring unit 110 configured to acquire the thickness distribution of the first wafer W before being subjected to the finishing grinding, and the thickness measuring unit 120 configured to acquire the thickness distribution of the first wafer W after being subjected to the finishing grinding and calculate TTV of the first wafer W. The thickness measuring unit 110 (120) measures the thickness of the first wafer W at multiple points thereof by emitting, for example, IR light to the first wafer W, and acquires the in-surface thickness distribution of the first wafer W based on the measured thicknesses. Further, the thickness measuring unit 120 calculates the TTV of the first wafer W after being subjected to the finishing grinding processing based on the acquired in-surface thickness distribution. The IR light is emitted to the combined wafer T from above the combined wafer T held by the chuck 31, that is, from the first wafer W side, for example. In addition, as stated above, the TTV of the first wafer W before being subjected to the finishing grinding processing may be calculated by using the thickness measuring unit 110.

Figure 6A:
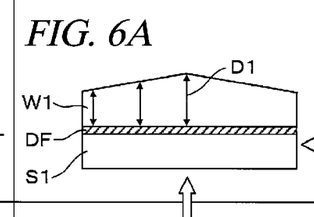
FIG. 6A to FIG. 6G are explanatory diagrams illustrating an example of main processes of a processing.

In the present exemplary embodiment, in the processing of a first sheet of combined wafer T1 among the plurality of combined wafers T, the thickness of a first wafer W1 before being subjected to the finishing grinding is first measured at multiple points thereof by the thickness measuring unit 110, and film thickness distribution data D1 as one thickness distribution is acquired, as shown in FIG. 6A. The acquired film thickness distribution data D1 is output to the controller 130.

Subsequently, a rear surface W1b of the first wafer W1 of the combined wafer T1 is finely ground by the finishing grinding unit 100.

In the finishing grinding of the first wafer W1 in the combined wafer T1, a grinding amount in the surface of the first wafer W1 is decided based on the film thickness distribution data D1 such that the in-surface thickness of the first wafer W1 becomes uniform, that is, the flatness of the first wafer W1 detected from the film thickness distribution data D1 is improved. Specifically, the finishing grinding amount is increased at a position where the thickness is found to be large in the surface of the first wafer W1, whereas the finishing grinding amount is decreased at a position where the thickness is found to be small.

Figure 6B:
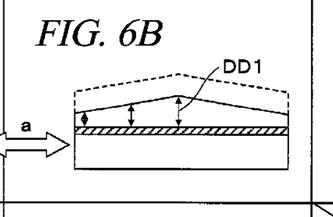

Next, as shown in FIG. 6B, the thickness of the combined wafer T1 after being subjected to the finishing grounding is measured at multiple points thereof by the thickness measuring unit 120, and film thickness distribution data DD1 as a thickness distribution after the finishing grinding is acquired. The obtained film thickness distribution data DD1 is output to the controller 130.

Here, as the first wafer W1 is finely ground based on the grinding amount decided based on the film thickness distribution data D1, it is desirable that the flatness of the first wafer W1 upon the completion of the finishing grinding is improved, that is, the thickness of the first wafer W1 is uniform in the surface thereof. However, depending on the wear of the finishing grinding whetstone, the parallelism between the chuck 31 and the finishing grinding whetstone, and other device characteristics, the flatness of the first wafer W1 may not be improved as illustrated in FIG. 6B.

As a resolution, in the processing according to the present exemplary embodiment, difference data a between the film thickness distribution data D1 and the film thickness distribution data DD1 is acquired as first difference data. The obtained difference data a is output to the controller 130. Further, the difference data a is acquired based on the film thickness distribution data D1 and DD1 acquired at the same point in the surface of the wafer W.

The difference data a is a difference between the film thickness distribution data of the first wafer W before and after being subjected to the finishing grinding in the finishing grinding unit 100. That is, tendency of deterioration of flatness due to the device characteristics in the finishing grinding unit 100 can be calculated based on the difference data a. In the processing according to the present exemplary embodiment, in the processing of a second sheet of combined wafer onwards (combined wafer Tn (n≥2)), the finishing grinding amount is decided based on the difference data a so as to offset the tendency of deterioration of flatness due to the device characteristics. Accordingly, in the processing of the second sheet of combined wafer T onwards, the flatness of the first wafer W can be appropriately improved.

In addition, the finishing grinding amount in the finishing grinding unit 100 is adjusted by adjusting the relative inclination of the chuck base 32 with respect to the finishing grinding whetstone by the inclination adjuster 33, for example.

Figure 6C:
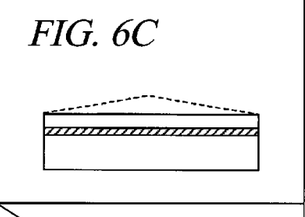

In the combined wafer T1 from which the film thickness distribution data DD1 has been acquired, the first wafer W1 is re-ground based on the acquired difference data a, as shown in FIG. 6C, to offset the tendency of deterioration of the flatness of the first wafer W1 due to the device characteristics. This re-grinding of the first wafer W1 is performed in the finishing grinding unit 100. Further, when there is found no difference between the film thickness distribution data D1 and the film thickness distribution data DD1, that is, when no problem is found in the device characteristics of the finishing grinding unit 100, the re-grinding of the first wafer W1 may be omitted.

Thereafter, the combined wafer T1 upon the completion of the processing is transferred to the cassette Ct via the second cleaning unit 70 and the first cleaning unit 60. Then, the processing on the second combined wafer T2 is started.

Figure 6D:
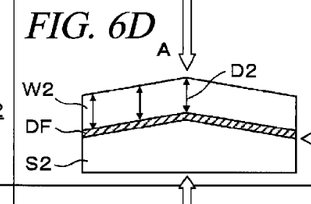

In the processing of the combined wafer T2, the thickness of a first wafer W2 before being subjected to the finishing grinding is measured at multiple points thereof by the thickness measuring unit 110, and film thickness distribution data D2 is acquired as one thickness distribution, as depicted in FIG. 6D. The acquired film thickness distribution data D2 is output to the controller 130.

Figure 7:
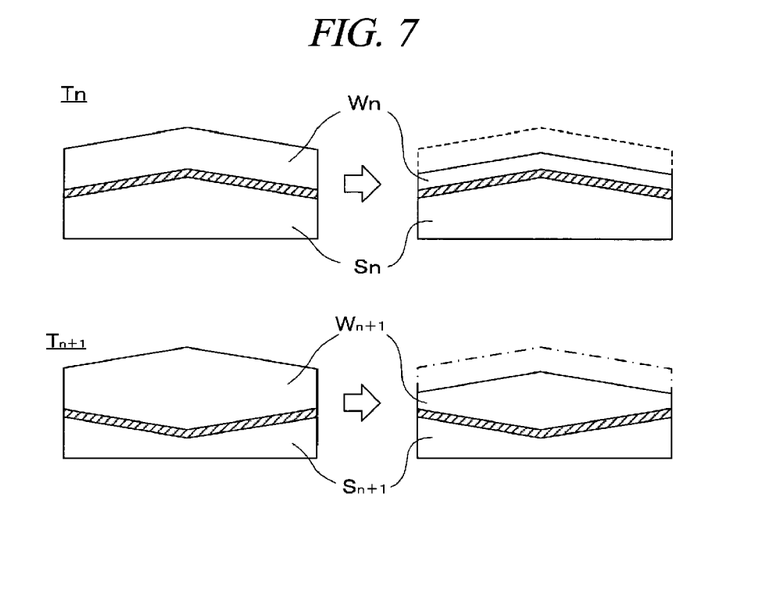
FIG. 7 is an explanatory diagram schematically illustrating degradation of TTV of a first wafer.

Here, for the first wafer W2, as a finishing grinding amount is determined based on a grinding amount decided based on difference data A, it is desirable that the flatness of the first wafer W2 is improved, that is, the thickness of the first wafer W2 becomes uniform in the surface thereof. However, as shown in FIG. 6A and FIG. 6D, when shape characteristics of a second wafer S1 and a second wafer S2 are different, the flatness of the first wafer W2 may not be improved if the first wafer W1 and the first wafer W2 are ground under the same conditions. Specifically, as shown in FIG. 7, when the second wafer Sn has a convex shape with a protruding center portion and the second wafer $S_{n+1}$ has a concave shape with a recessed center portion, only an outer peripheral portion of the first wafer Wn+1 may be ground, leaving the center portion thereof not ground if the first wafer Wn and the first wafer $W_{n+1}$ are ground under the same conditions.

As a resolution, in the processing according to the present exemplary embodiment, the difference data A between the film thickness distribution data D1 and the film thickness distribution data D2 is obtained as second difference data. The acquired difference data A is output to the controller 130.

The difference data A is a difference in the film thickness distribution data between the first wafer W1 and the first wafer W2 before being subjected to the finishing grinding in the finishing grinding unit 100. That is, tendency of deterioration of flatness caused by the shape characteristics of the second wafer S can be calculated based on the difference data A. In the processing according to the present exemplary embodiment, in the processing of the second sheet of combined wafer T2, the inclination of the chuck base 32 is adjusted based on the difference data A to offset the tendency of deterioration of flatness due to the shape characteristics, and, also, a finishing grinding amount in the surface of the first wafer W2 is decided. Accordingly, in the processing of the combined wafer T2, the flatness of the first wafer W2 can be appropriately improved.

As described above, in the combined wafer T2 from which the film thickness distribution data D2 has been acquired, a rear surface W2b of the first wafer W2 is finely ground by the finishing grinding unit 100. In the finishing grinding of the first wafer W2, correction of the inclination of the chuck base 32 is performed based on the difference data A in addition to the adjustment of the inclination of the chuck base 32 based on the difference data a described above, and a finishing grinding amount is decided. Accordingly, in the processing of the second sheet of combined wafer T2, the flatness of the first wafer W2 may be appropriately improved.

Figure 6E:
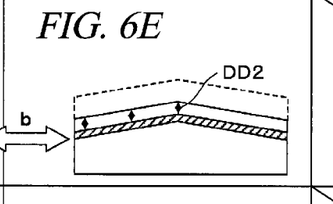

Subsequently, for the combined wafer T2, the thickness of the first wafer W2 after being subjected to the finishing grinding is measured at multiple points thereof by the thickness measuring unit 120, and film thickness distribution data DD2 as a thickness distribution upon the completion of the finishing grinding is obtained, as depicted in FIG. 6E. The obtained film thickness distribution data DD2 is output to the controller 130.

Once the film thickness distribution data DD2 is acquired, difference data b between the film thickness distribution data D2 and the film thickness distribution data DD2 is acquired as first difference data. The acquired difference data b is output to the controller 130. Further, the difference data b is acquired based on the film thickness distribution data D2 and DD2 measured at the same point in the surface of the wafer W.

The difference data b is a difference between the film thickness distribution data of the first wafer W2 before and after the finishing grinding in the finishing grinding unit 100. The finishing grinding unit 100 repeatedly performs the finishing grinding of the first wafers W in the plurality of combined wafers T. As a result, the device characteristics due to, for example, wear of the finishing grinding whetstone change with a lapse of time. Further, the device characteristics may also change over time due to, for example, environmental factors (for example, atmosphere temperature, etc.) at the time when the finishing grinding is performed. In view of these, in the grinding processing according to the present exemplary embodiment, the inclination of the chuck base 32 is adjusted, following the trend of deterioration of flatness due to the device characteristics over time, to thereby decide the finishing grinding amount. Therefore, even in the processing of a third sheet of combined wafer T onwards, the flatness of the first wafer W can be appropriately improved.

The combined wafer T2 from which the film thickness distribution data DD2 has been acquired is transferred to the cassette Ct via the second cleaning unit 70 and the first cleaning unit 60. Then, the third sheet of combined wafer T3 is taken out from the cassette Ct, and the processing on this combined wafer T3 is begun.

Figure 6F:
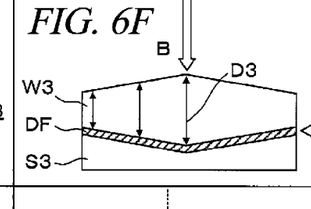

In the processing of the combined wafer T3, the thickness of a first wafer W3 before being subjected to the finishing grinding is measured at multiple points thereof by the thickness measuring unit 110, and film thickness distribution data D3 is obtained as one thickness distribution, as illustrated in FIG. 6F. The acquired film thickness distribution data D3 is output to the controller 130.

Further, in the processing of the combined wafer T3, difference data B between the film thickness distribution data D1 and the film thickness distribution data D3 is acquired as second difference data indicating shape characteristics of a second wafer S3. The obtained difference data B is output to the controller 130. The difference data B may be a difference between the film thickness distribution data D2 and the film thickness distribution data D3 as long as the shape characteristics of the second wafer S3 can be acquired.

In the combined wafer T3 from which the film thickness distribution data D3 has been acquired, a rear surface W3b of the first wafer W3 is finely ground by the finishing grinding unit 100. In the finishing grinding of the first wafer W3, the inclination of the chuck base 32 is adjusted based on the difference data b and the difference data B, and the finishing grinding amount is determined. Thus, in the processing of the third sheet of combined wafer T3, the flatness of the first wafer W3 can be appropriately improved. Further, when no difference is found between the difference data a and the difference data b, that is, when no change is found in the device characteristics of the finishing grinding unit 100, the inclination may be adjusted, that is, the finishing grinding amount may be decided based on the difference data a and the difference data B in the finishing grinding of the first wafer W3.

Figure 6G:
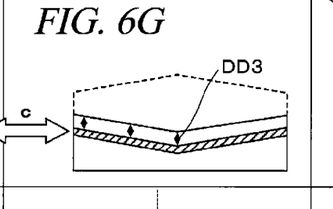

Next, as shown in FIG. 6G, in the combined wafer T2, the thickness of the first wafer W3 after being subjected to the finishing grinding is measured at multiple points thereof by the thickness measuring unit 120, and film thickness distribution data DD3 is acquired as a thickness distribution upon the completion of the finishing grinding. The obtained film thickness distribution data DD3 is output to the controller 130.

After the film thickness distribution data DD3 is acquired, difference data c between the film thickness distribution data D3 and the film thickness distribution data DD3 is then acquired as first difference data. The obtained difference data c is output to the controller 130. Further, the difference data c is acquired based on the film thickness distribution data D3 and DD3 acquired at the same point in the surface of the wafer W.

According to the above-described exemplary embodiment, the difference data A, B, . . . , which are differences in the shape characteristics of the second wafers S in the plurality of combined wafers T, are acquired based on the film thickness distribution data before being subjected to the finishing grinding obtained for each of the plurality of combined wafers T processed in the processing apparatus 1. Since the finishing grinding amount of the first wafer W is determined by adjusting (correcting) the inclination of the chuck base 32 based on these difference data, it is possible to control the final thickness of the first wafer W uniformly. That is, the flatness of the first wafer W can be appropriately improved.

At this time, according to the present exemplary embodiment, the shape characteristics of the second wafer S can be acquired only by measuring the thickness of the first wafer W by the thickness measuring unit 110 and the thickness measuring unit 120. That is, even when the total thickness of the combined wafer T and the thickness of the second wafer S cannot be measured because of the device layer D formed on the front surface Wa of the first wafer W, for example, the flatness of the first wafer W can be improved by appropriately acquiring the shape characteristics of the second wafer S.

Further, in the present exemplary embodiment, the difference data a as a device characteristic of the finishing grinding unit 100 is acquired based on the film thickness distribution data before and after the finishing grinding on the first sheet of combined wafer T1. Since the finishing grinding amount of the first wafer W is determined by adjusting (correcting) the inclination of the chuck base 32 based on the difference data a, the final thickness of the first wafer W can be uniformly controlled more properly. That is, the flatness of the first wafer W can be improved more appropriately.

In addition, in the present exemplary embodiment, the difference data b, c, . . . , which are device characteristics of the finishing grinding unit 100, are obtained based on the film thickness distribution data before and after the finishing grinding on the second sheet of combined wafer onwards (combined wafer Tn). As a result, even if the device characteristics of the finishing grinding unit 100 change with a lapse of time due to various factors, the finishing grinding amount of the first wafer W can be decided by adjusting (correcting) the inclination of the chuck base 32 to follow the change of the device characteristics over time. Therefore, the flatness of the first wafer W can be improved more appropriately.

Here, in the finishing grinding of the second sheet of combined wafer onwards (combined wafer Tn), there is no need to perform re-grinding as in the case of the finishing grinding of the first combined wafer T1. This is because, during the finishing grinding of the first combined wafer T1, the TTV adjustment due to the device characteristics has already been performed based on the difference data A, so occurrence of TTV deterioration to such an extent that re-grinding is required is suppressed. In this way, since it is not necessary to perform re-grinding on the combined wafer T2 onwards, the throughput regarding the finishing grinding of the first wafer W can be appropriately improved.

In addition, in the above-described exemplary embodiment, in the processing of the first sheet of combined wafer T1, the difference data a that is the device characteristic of the finishing grinding unit 100 is acquired. However, the difference data a may be acquired in advance by, for example, grinding a combined wafer T0 as a dummy combined substrate. By acquiring the device characteristic in advance using the dummy substrate in this way, it is not necessary to acquire device characteristic in the processing of the first sheet of combined wafer T1 in the cassette Ct. That is, since the above-described re-grinding need not be performed in the processing of the combined wafer T1, the throughput regarding the finishing grinding of the combined wafer T1 can be improved.

Furthermore, in the above-described exemplary embodiment, the finishing grinding amount of the first wafer W is adjusted by inclining the chuck base 32 with the inclination adjuster 33, to thereby improve the flatness of the first wafer W. However, the method of adjusting the finishing grinding amount is not limited thereto. By way of example, the inclination adjuster 33 may adjust the finishing grinding amount of the first wafer W by inclining the grinding whetstone instead. Moreover, even the inclination adjuster 33 may not be used as long as the finishing grinding amount of the first wafer W can be adjusted.

Additionally, in the above-described exemplary embodiment, the film thickness distribution data before and after the finishing grinding of the first wafer W1 are acquired, and the flatness of the first wafer W1 is adjusted based on the acquired film thickness distribution data. However, the adjustment of the flatness may be performed during the rough grinding or the intermediate grinding of the first wafer W1. That is, film thickness distribution data before and after the rough grinding or before and after the intermediate grinding are further acquired, and based on the obtained film thickness distribution data, the relative inclination of the chuck base 32 with respect to the grinding whetstone when performing the rough grinding or the intermediate grinding may be adjusted.

Moreover, the above exemplary embodiment has been described for the example where the thickness of the second substrate including the metal film cannot be measured due to the influence of the metal film(s) (device layer(s)) interposed between the first wafer W and the second wafer S. However, the technique of the present disclosure is not limited to being applied to the case where the combined wafer T has the metal film, but may be appropriately applied in any of various cases where the thickness of the second wafer S cannot be calculated properly.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to improve the flatness of the first substrate appropriately in the combined substrate in which the first substrate and the second substrate are bonded to each other.

We claim:

1. A substrate processing method of performing, in a substrate processing apparatus, finishing grinding on a roughly ground first substrate in a combined substrate in which the first substrate and a second substrate are bonded to each other,
wherein multiple combined substrates are successively processed in the substrate processing apparatus, and
wherein the substrate processing method comprises:
measuring, by a first thickness distribution measurement device, a first thickness distribution of the first substrate in a first one of the multiple combined substrates before being subjected to the finishing grinding;
measuring, by the first thickness distribution measurement device, a second thickness distribution of the first substrate in a second one of the multiple combined substrates before being subjected to the finishing grinding;

deciding a relative inclination between a substrate holder configured to hold the second one of the multiple combined substrates and a grinder configured to perform the finishing grinding on the second one of the multiple combined substrates, based on first difference data between the first thickness distribution and the second thickness distribution; and performing finishing grinding on the first substrate in the second one of the multiple combined substrates while holding the second one of the multiple combined substrates at the inclination which is decided.

2. The substrate processing method of claim 1, further comprising:

measuring, by a second thickness distribution measurement device, a third thickness distribution of the first substrate in the first one of the multiple combined substrates after being subjected to the finishing grinding, wherein the relative inclination between the substrate holder configured to hold the second one of the multiple combined substrates and the grinder is decided based on, in addition to the first difference data, second difference data between the first thickness distribution of the first substrate in the first one of the multiple combined substrates before being subjected to the finishing grinding and the third thickness distribution of the first substrate in the first one of the multiple combined substrates after being subjected to the finishing grinding.

3. The substrate processing method of claim 1, wherein the first one of the multiple combined substrates is a dummy combined substrate processed in the substrate processing apparatus before the remainder of the multiple combined substrates are processed.

4. The substrate processing method of claim 1, wherein the first one of the multiple combined substrates is a combined substrate processed before the second one of the multiple combined substrates among the multiple combined substrates is processed.

5. The substrate processing method of claim 4, further comprising:

measuring a fourth thickness distribution of the first substrate in the first one of the multiple combined substrates after being subjected to the finishing grinding; and deciding the relative inclination between the substrate holder configured to hold the first one of the multiple combined substrates and a grinder configured to perform the finishing grinding on the first one of the multiple combined substrates based on third difference data between the first thickness distribution of the first substrate in the first one of the multiple combined substrates before being subjected to the finishing grinding and the fourth thickness distribution of the first substrate in the first one of the multiple combined substrates after being subjected to the finishing grinding, and re-grinding the first substrate in the first one of the multiple combined substrates.

6. A substrate processing apparatus configured to grind a first substrate in a combined substrate in which the first substrate and a second substrate are bonded to each other, the substrate processing apparatus comprises:

a substrate holder configured to hold the combined substrate;

a finishing grinder configured to perform finishing grinding on the first substrate that is roughly ground;

a first thickness distribution measurement device configured to measure a thickness distribution of the first substrate before being subjected to the finishing grinding; and a controller and a storage including a computer program, wherein the storage and the computer program are configured, with the controller, to control an operation of the first thickness distribution measurement device, the finishing grinder, and the substrate holder, the controller processes multiple combined substrates successively in the substrate processing apparatus, and the controller is configured to:

measure, by the first thickness distribution measurement device, a first thickness distribution of the first substrate in a first one of the multiple combined substrates before being subjected to the finishing grinding;

measure, by the first thickness distribution measurement device, a second thickness distribution of the first substrate in a second one of the multiple combined substrates, which is processed after the first one, before being subjected to the finishing grinding;

decide a relative inclination between the substrate holder and the finishing grinder, based on first difference data between the first thickness distribution and the second thickness distribution; and control the finishing grinder and the substrate holder to perform finishing grinding on the first substrate in the second one of the multiple combined substrates while holding the second one of the multiple combined substrates at the inclination which is decided.

7. The substrate processing apparatus of claim 6, further comprising:

a second thickness distribution measurement device configured to measure a thickness distribution of the first substrate after being subjected to the finishing grinding, wherein the controller decides the relative inclination between the substrate holder configured to hold the second one of the multiple combined substrates and the finishing grinder based on, in addition to the first difference data, second difference data between the first thickness distribution of the first substrate in the first one of the multiple combined substrates before being subjected to the finishing grinding and a third thickness distribution of the first substrate in the first one of the multiple combined substrates measured by the second thickness distribution measurement device after being subjected to the finishing grinding.

8. The substrate processing apparatus of claim 6, wherein the first one of the multiple combined substrates is a dummy combined substrate processed in the substrate processing apparatus before the remainder of the multiple combined substrates are processed.

9. The substrate processing apparatus of claim 6, wherein the first one of the multiple combined substrates is a combined substrate processed before the second one of the multiple combined substrates among the multiple combined substrates is processed.

10. The substrate processing apparatus of claim 9, further comprising:

a second thickness distribution measurement device configured to measure a thickness distribution of the first substrate after being subjected to the finishing grinding, wherein the controller decides the relative inclination between the substrate holder configured to hold the first one of the multiple combined substrates and the finishing grinder based on third difference data between the first thickness distribution of the first substrate in the first one of the multiple combined substrates before being subjected to the finishing grinding and a fourth thickness distribution of the first substrate in the first one of the multiple combined substrates after being subjected to the finishing grinding, and controls the finishing grinder and the substrate holder to perform regrinding of the first substrate in the first one of the multiple combined substrates.

* * * * *